(12) United States Patent
Yang et al.

(10) Patent No.: US 11,280,809 B2
(45) Date of Patent: Mar. 22, 2022

(54) METHOD AND APPARATUS FOR PROCESSING OSCILLOSCOPE SIGNAL AND OSCILLOSCOPE

(71) Applicant: AUTEL INTELLIGENT TECHNOLOGY CORP., LTD., Guangdong (CN)

(72) Inventors: Liangliang Yang, Guangdong (CN); Xianchong Zhou, Guangdong (CN)

(73) Assignee: AUTEL INTELLIGENT TECHNOLOGY CORP., LTD., Shenzhen (CN)

( * ) Notice: Subject to any disclaimer, the term of this patent is extended or adjusted under 35 U.S.C. 154(b) by 14 days.

(21) Appl. No.: 16/918,710

(22) Filed: Jul. 1, 2020

(65) Prior Publication Data
US 2020/0333378 A1    Oct. 22, 2020

Related U.S. Application Data

(63) Continuation of application No. PCT/CN2019/070474, filed on Jan. 4, 2019.

(51) Int. Cl.
*G01R 13/02* (2006.01)
*G06F 3/04845* (2022.01)

(52) U.S. Cl.
CPC ...... *G01R 13/0218* (2013.01); *G06F 3/04845* (2013.01)

(58) Field of Classification Search
CPC .......................... G01R 13/0218; G06F 3/04845
See application file for complete search history.

(56) References Cited

U.S. PATENT DOCUMENTS

| 4,743,845 | A | * | 5/1988 | Diller | G01R 13/22 324/121 R |
| 4,972,138 | A | * | 11/1990 | Bush | G01R 31/3177 324/121 R |
| 5,162,723 | A | * | 11/1992 | Marzalek | G01R 23/16 324/121 R |
| 5,245,324 | A | * | 9/1993 | Jonker | F02P 17/08 324/121 R |
| 6,418,386 | B1 | * | 7/2002 | Wong-Lam | G01R 13/34 702/66 |

(Continued)

FOREIGN PATENT DOCUMENTS

| CN | 1618082 A | 5/2005 |
| CN | 201909804 A | 7/2011 |

(Continued)

*Primary Examiner* — Shen Shiau

(57) ABSTRACT

Embodiments of the present invention relate to the technical field of oscilloscopes and disclose a method and an apparatus for processing an oscilloscope signal and an oscilloscope. The method for processing the oscilloscope signal includes: obtaining a voltage signal; determining high and low level signals in the voltage signal according to a reference voltage; determining a valid digital signal from the high and low level signals; and displaying a waveform image of the digital signal. According to the embodiments of the present invention, the voltage signal may be converted into the digital signal without digital processing on the voltage signal via a hardware device such as an analog converter, thereby reducing costs of the oscilloscope and facilitating user operation and carrying.

10 Claims, 4 Drawing Sheets

(56) References Cited

U.S. PATENT DOCUMENTS

| | | | | |
|---|---|---|---|---|
| 6,545,852 B1* | 4/2003 | Arnold | ............... | B60T 8/885 |
| | | | | 361/152 |
| 6,570,592 B1* | 5/2003 | Sajdak | ............... | G01R 13/02 |
| | | | | 345/440.1 |
| 6,571,185 B1* | 5/2003 | Gauland | ............... | G01R 13/02 |
| | | | | 702/68 |
| 6,624,829 B1* | 9/2003 | Beck | ............... | G06F 11/25 |
| | | | | 702/117 |
| 7,741,960 B1* | 6/2010 | Hoogenakker | ...... | B60T 13/662 |
| | | | | 340/431 |
| 2003/0115003 A1 | 6/2003 | Saitou | | |
| 2010/0036630 A1* | 2/2010 | Ho | ............... | G01R 13/0218 |
| | | | | 702/67 |
| 2010/0182075 A1* | 7/2010 | Yang | ............... | H02J 7/1438 |
| | | | | 327/540 |
| 2016/0268799 A1* | 9/2016 | Urase | ............... | H02P 7/06 |
| 2020/0334189 A1* | 10/2020 | Yang | ............... | G06F 13/42 |

FOREIGN PATENT DOCUMENTS

| | | | |
|---|---|---|---|
| CN | 102841229 | A | 12/2012 |
| CN | 103604966 | A | 2/2014 |
| CN | 107436377 | A | 12/2017 |
| CN | 107483053 | A | 12/2017 |
| CN | 108181492 | A | 6/2018 |

\* cited by examiner

METHOD AND APPARATUS FOR PROCESSING OSCILLOSCOPE SIGNAL AND OSCILLOSCOPE

This application is a continuation application of International Application No. PCT/CN2019/070474, filed on Jan. 4, 2019, which claims priority of Chinese Patent Application No. 201810010439.0, filed on Jan. 5, 2018, which is incorporated herein by reference in its entirety.

BACKGROUND

Technical Field

The present application relates to the technical field of oscilloscopes, and in particular, to a method and an apparatus for processing an oscilloscope signal and an oscilloscope.

Related Art

An oscilloscope is a basic test and measurement device in the electronics industry, and may convert an electrical signal that is invisible to the naked eye into a visible image, which is convenient for people to study the changes in various electrical phenomena. An oscilloscope can be used to observe waveform curves of various signal amplitudes over time, and may further be used to measure different parameters such as a voltage, a current, a frequency, a phase and an amplitude of the electrical signal. The oscilloscope may generally be divided into an analog oscilloscope and a digital oscilloscope.

Currently, as a high-performance oscilloscope, the digital oscilloscope is widely used in development and maintenance of electronic products. However, a traditional digital oscilloscope generally needs to convert an analog signal into a digital signal through a hardware device such as an analog-to-digital converter (ADC), to capture waveforms with a series of sample values and display the series of sample values. Moreover, the traditional digital oscilloscope is expensive and operated inconveniently. The oscilloscope has complicated buttons and display screens, causing the oscilloscope to be bulky and difficult to carry.

Therefore, there is an urgent need to provide a software manner to convert the analog signal into the digital signal to resolve the foregoing problem, thereby reducing costs of the oscilloscope and facilitating user operation and carrying.

SUMMARY

The present invention is mainly intended to provide a method and an apparatus for processing an oscilloscope signal and an oscilloscope, so that a voltage signal can be converted into a digital signal in a software manner, thereby reducing costs of the oscilloscope and facilitating user operation and carrying.

Embodiments of the present invention disclose the following technical solutions.

According to a first aspect, an embodiment of the present invention provides a method for processing an oscilloscope signal, the method including:
obtaining a voltage signal;
determining high and low level signals in the voltage signal according to a reference voltage;
determining a valid digital signal from the high and low level signals; and
displaying a waveform image of the digital signal.

In some embodiments, the determining a valid digital signal from the high and low level signals includes:
obtaining a baud rate of a measured device;
obtaining collection frequencies of the high and low level signals; and
determining a valid digital signal from the high and low level signals according to the collection frequency and the baud rate.

In some embodiments, the determining a valid digital signal from the high and low level signals according to the collection frequency and the baud rate includes:
calculating a ratio of the frequency to the baud rate; and
using, according to the ratio, a signal obtained through extraction from the high and low level signals at an equal interval as the digital signal.

In some embodiments, the method further includes:
receiving a user operation on the waveform image of the digital signal; and
processing the waveform image according to the user operation.

In some embodiments, the processing the waveform image according to the user operation includes:
if the user operation is a scaling operation on the waveform image, scaling the waveform image; or
if the user operation is a movement operation on the waveform image, adjusting a display segment of the waveform image; or
if the user operation is a viewing operation on the waveform image, displaying a signal parameter that is related to an image area indicated by the viewing operation and that is in the waveform image.

According to a second aspect, an embodiment of the present invention provides an apparatus for processing an oscilloscope signal, the apparatus including:
a voltage signal obtaining module configured to obtain a voltage signal;
a high and low level signal determining module configured to determine high and low level signals in the voltage signal according to a reference voltage; and
a digital signal determining module configured to determine a valid digital signal from the high and low level signals; and
a waveform image display module configured to display a waveform image of the digital signal.

In some embodiments, the digital signal determining module includes:
a baud rate obtaining unit configured to obtain a baud rate of a measured device;
a collection frequency obtaining unit configured to obtain collection frequencies of the high and low level signals; and
a digital signal determining unit configured to determine a valid digital signal from the high and low level signals according to the collection frequency and the baud rate.

In some embodiments, the digital signal determining unit is specifically configured to:
calculate a ratio of the frequency to the baud rate; and
use, according to the ratio, a signal obtained through extraction from the high and low level signals at an equal interval as the digital signal.

In some embodiments, the apparatus further includes:
a user operation receiving module configured to receive a user operation on the waveform image of the digital signal; and
a waveform image processing module configured to process the waveform image according to the user operation.

In some embodiments, the waveform image processing module is specifically configured to:

if the user operation is a scaling operation on the waveform image, scale the waveform image; or if the user operation is a movement operation on the waveform image, adjust a display segment of the waveform image; or if the user operation is a viewing operation on the waveform image, display a signal parameter that is related to an image area indicated by the viewing operation and that is in the waveform image.

According to a third aspect, an embodiment of the present invention provides an oscilloscope, including:

at least one processor; and a memory communicatively connected to the at least one processor, where the memory stores instructions that may be executed by the at least one processor and that are executed by the at least one processor, so that the at least one processor can perform the foregoing method for processing the oscilloscope signal.

According to a fourth aspect, an embodiment of the present invention provides a computer program product that includes a computer program stored in a non-volatile computer readable storage medium, the computer program including a program instruction that, when executed by an oscilloscope, causes the oscilloscope to perform the foregoing method for processing the oscilloscope signal.

According to a fifth aspect, an embodiment of the present invention provides a non-volatile computer readable storage medium that stores a computer executable instruction that is used to cause an oscilloscope to perform the foregoing method for processing the oscilloscope signal.

The beneficial effect of the embodiments of the present invention is that, in comparison to the prior art, in the embodiments of the present invention, the high and low level signals in the voltage signal are determined according to the reference voltage, and the valid digital signal is determined from the high and low level signals, so that the voltage signal may be converted into the digital signal without digital processing on the voltage signal via a hardware device such as an analog converter, thereby reducing costs of the oscilloscope and facilitating user operation and carrying.

DETAILED DESCRIPTION

The technical solutions in the embodiments of the present invention will be described below with reference to the accompanying drawings in the embodiments of the present invention. Obviously, the described embodiments are a part of the present invention, but not all of them. Based on the embodiments of the present invention, all other embodiments obtained by a person of ordinary skill in the art without creative efforts shall fall within the protection scope of the present invention.

In addition, the technical features involved in the various embodiments of the present invention described below can be combined with each other as long as they do not conflict with each other.

Embodiment 1

Embodiments of the present invention provide a method and an apparatus for processing an oscilloscope signal and an oscilloscope, through the method and apparatus for processing an oscilloscope signal and the oscilloscope, a voltage signal may be converted into a digital signal without relying on a hardware device, thereby reducing costs of the oscilloscope and facilitating user operation and carrying. The following illustrates an application environment of the foregoing method.

Figure 1:
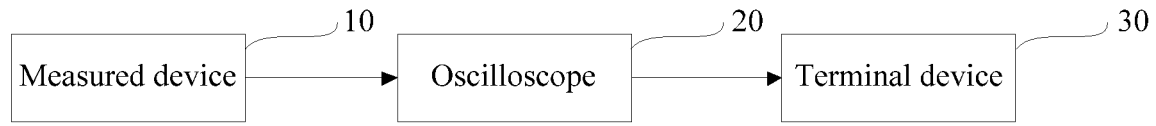
FIG. 1 is a schematic diagram of an application environment of a method for processing an oscilloscope signal according to an embodiment of the present invention.

Referring to FIG. 1, FIG. 1 is a schematic diagram of an application environment of a method for processing an oscilloscope signal according to an embodiment of the present invention. The application scenario includes: a measured device 10, an oscilloscope 20 and a terminal device 30. During use, the oscilloscope 20 is connected to the measured device 10 and the terminal device 30, respectively. First, the oscilloscope 20 interacts with the measured device 10, thereby obtaining a voltage signal. Then the oscilloscope 20 processes the voltage signal, that is, determines high and low level signals in the voltage signal according to a reference voltage, and determines a valid digital signal from the high and low level signals. Finally, a waveform image of the digital signal is displayed. The displaying a waveform image of the digital signal may include: displaying a waveform image of the digital signal on the oscilloscope 20; or sending the waveform image of the digital signal to the terminal device 30, to cause the terminal device 30 to display the waveform image of the digital signal. The following description is made by using the sending a waveform image of the digital signal to the terminal device 30, to cause the terminal device 30 to display the waveform image of the digital signal as an example. The measured device includes an electronic control unit in a vehicle.

In another application scenario, the oscilloscope may be used as a module or unit and integrated in the terminal device 30.

In still another application scenario, the terminal device 30 may have an oscilloscope function and may directly communicate with the measured device 10.

Alternatively, in still another application scenario, the oscilloscope may be provided with a display apparatus such as a display screen, and the oscilloscope may display a signal.

Figure 2:
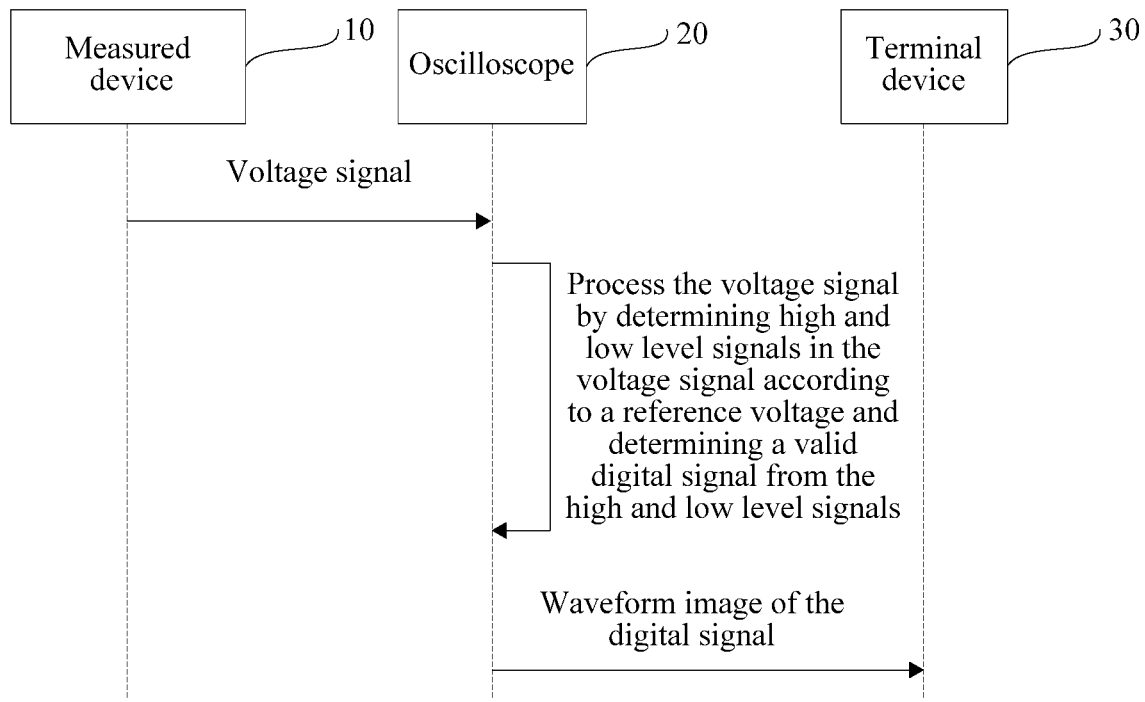
FIG. 2 is a schematic diagram of a specific implementation principle for processing an oscilloscope signal according to an embodiment of the present invention.

Referring to FIG. 2, FIG. 2 is a schematic diagram of a specific implementation principle for processing an oscilloscope signal based on the application environment shown in FIG. 1 according to an embodiment of the present invention. Definitely, for other application environments, the terminal device may implement the following method performed by the oscilloscope, or the oscilloscope may implement the following method performed by the terminal device, which is not limited herein. The specific implementation principle includes the following.

1. The oscilloscope 20 interacts with the measured device 10, thereby obtaining a voltage signal through collection. Specifically, the oscilloscope 20 may perform data collection at a preset sampling frequency to obtain the voltage signal. The voltage signal is an analog signal, may be displayed on the oscilloscope 20 and may be represented as a display waveform of an analog signal.

2. The oscilloscope 20 processes the voltage signal. The specific method of processing the voltage signal may include:

first determining, by the oscilloscope 20, high and low level signals in the voltage signal according to a reference voltage. Specifically, the oscilloscope 20 obtains a reference voltage and determines the high and low level signals in the voltage signal according to the reference voltage, the high and low level signals including a high level signal and a low level signal. The reference voltage may be preset, or a reference voltage input by a user may be received through the terminal device 30 and then sent to the oscilloscope 20, thereby obtaining the reference voltage. For example, the terminal device 30 provides an interface for inputting a reference voltage to receive a reference voltage input by a user. For example, if the reference voltage is 0 V, the terminal device 30 transmits the reference voltage to the oscilloscope 20, and the oscilloscope 20 compares the reference voltage (0 V) with all data in the voltage signal, where a point less than 0 V in all the data is considered as a low level signal, and a point greater than 0 V is considered as a high level signal. A value of the high level signal is represented by a number "1", and a value of the low level signal is represented by a number "0".

Then the oscilloscope 20 determines a valid digital signal from the high and low level signals. Since an amount of data generated by the measured device 10 per second and an amount of data collected by the oscilloscope 20 per second may be inconsistent or differ considerably, when the two are inconsistent or differ considerably, there is a large amount of invalid duplicated data in data collected by the oscilloscope 20. Therefore, it is necessary to eliminate invalid data and obtain valid data, that is, necessary to determine the valid digital signal from the high and low level signals.

The determining a valid digital signal from the high and low level signals may include: obtaining a baud rate of a measured device; obtaining collection frequencies of the high and low level signals; and determining a valid digital signal from the high and low level signals according to the collection frequency and the baud rate.

The baud rate of the measured device 10 refers to the amount of data generated by the measured device 10 per second. Since the high and low level signals are determined based on the reference voltage, the high and low level signals have a same frequency as the voltage signal, that is, a sampling frequency at which the oscilloscope 20 performs sampling.

Specifically, the collection frequency of the high and low level signals is equal to the amount of data collected by the oscilloscope per second. The oscilloscope 20 may obtain the baud rate of the measured device based on an operation of setting the baud rate of the measured device by a user.

Similarly, the oscilloscope 20 may alternatively obtain, based on an operation of setting the sampling frequency of the oscilloscope by the user, the sampling frequency at which the oscilloscope 20 collects data, that is, the collection frequency of the high and low level signals.

Further, the determining a valid digital signal from the high and low level signals according to the collection frequency and the baud rate may specifically include:

calculating a ratio of the collection frequency to the baud rate; and using, according to the ratio, a signal obtained through extraction from the high and low level signals at an equal interval as the digital signal.

For example, the baud rate of the measured device 10 is 100 Baud (Baud is a unit of the baud rate). The sampling frequency of the oscilloscope 20 is 1000 Hz (frequency), that is, the measured device 10 generates 100 pieces of data per second, and the oscilloscope 20 collects 1000 pieces of data per second. A ratio that is of the collection frequency to the baud rate and that is obtained through calculation is 10:1, and according to the ratio, a signal obtained through extracting one piece of data from every 10 pieces of data from all the high and low level signals is used as the digital signal. For example, if the amount of data of all the high and low level signals is 2000, and 1 piece of data is extracted from every 10 pieces of data, the amount of data of the obtained signal is 200, and the signal is used as the digital signal, that is, a valid signal in the high and low level signals.

The digital signal is determined through the collection frequency and the baud rate, and the sampling frequency of the oscilloscope 20 may be set for different measured devices, so that the sampling frequency of the oscilloscope 20 is close to the baud rate of the measured device 10 to eliminate a large number of invalid data, improve obtaining of valid data and improve efficiency of data processing. The digital signal may be binary data, such as "110101110000" and the like.

3. The oscilloscope 20 sends a waveform image of the digital signal to the terminal device 30, to cause the terminal device 30 to display the waveform image of the digital signal. For example, the waveform image of the digital signal is displayed on a user interface of the terminal device 30, for example, a square diagram for representing the digital signal. Optionally, the waveform image of the digital signal may be superimposed on the waveform image of the voltage signal, and displayed on the user interface of the terminal device 30.

It should be noted that, in the embodiment of the present invention, the measured device 10 may be various types of electronic components, for example, electronic components of an automobile. The terminal device 30 may be a personal computer (PC), a tablet, a smart phone, or the like.

It should further be noted that in some other embodiments, functions of the oscilloscope 20 and the terminal device 30 may be integrated into a same device, that is, the device may implement all the functions of the oscilloscope 20 and the terminal device 30.

In the embodiments of the present invention, the oscilloscope 20 determines the high and low level signals in the voltage signal according to the reference voltage, and determines the valid digital signal from the high and low level signals, so that the voltage signal may be converted into the digital signal without digital processing on the voltage signal via a hardware device such as an analog converter, thereby reducing costs of the oscilloscope and facilitating user operation and carrying.

Embodiment 2

Figure 3:
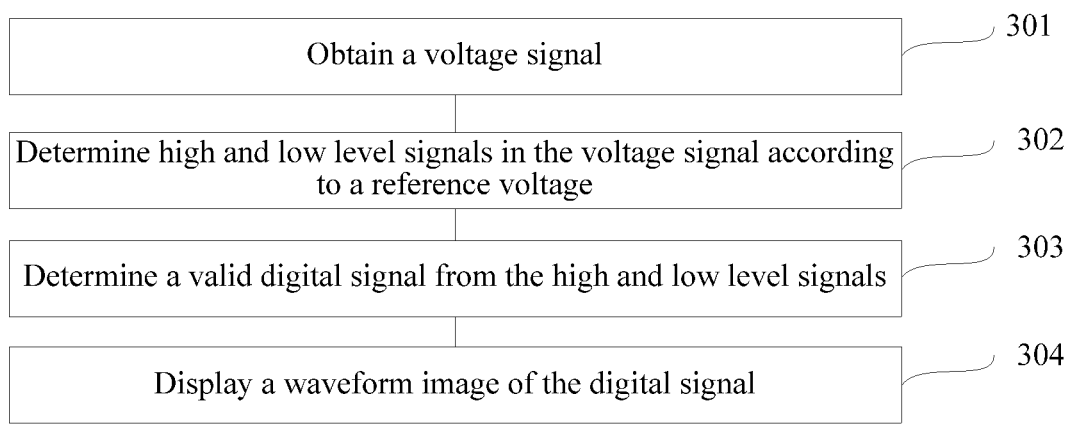
FIG. 3 is a schematic flowchart of a method for processing an oscilloscope signal according to an embodiment of the present invention.

FIG. 3 is a schematic flowchart of a method for processing an oscilloscope signal according to an embodiment of the present invention. The method for processing the oscilloscope signal provided in an embodiment of the present invention is applied to an oscilloscope, and may be performed by the oscilloscope 20 in FIG. 1.

Referring to FIG. 3, the method for processing the oscilloscope signal includes the following steps.

301: A voltage signal is obtained.

An oscilloscope is connected to a measured device to obtain the voltage signal. The voltage signal is an analog signal, and the voltage signal is a voltage that changes with time and may be represented as a waveform.

302: High and low level signals in the voltage signal are determined according to a reference voltage.

The reference voltage may be a user-defined voltage value. For example, a user input operation is received to obtain a reference voltage. In some embodiments, the reference voltage may further be a voltage value predefined by a system. The reference voltage is compared with all the data in the voltage signal to determine the high and low level signals in the voltage signal. For example, the reference voltage is 0 V, and the reference voltage is compared with all voltage values in the voltage signal. A voltage signal with a voltage value less than 0 V is set as a low level signal, and a voltage signal with a voltage value greater than 0 V is set as a high level signal. A value of the high level signal is represented by a number "1", and a value of the low level signal is represented by a number "0". The high and low level signals in the voltage signal are determined through the reference voltage, and amplitude values of each data point of the voltage signal may be converted into high and low level signals.

303: A valid digital signal is determined from the high and low level signals.

Since an amount of data generated by a measured device per unit time is inconsistent with an amount of data collected by the oscilloscope per unit time, it is necessary to determine a valid digital signal from the high and low level signals in the voltage signal and remove invalid high and low level signals. The valid digital signal may be obtained using any suitable method. For example, the valid digital signal is determined according to the baud rate of the measured device and a frequency at which the oscilloscope collects the voltage signal. The baud rate of the measured device refers to the amount of data generated by the measured device per second, and the frequency at which the voltage signal is collected refers to the amount of data collected by the oscilloscope per second, that is, the sampling frequency of the oscilloscope. For example, the baud rate of the measured device is 100 Baud. The sampling frequency of the oscilloscope is 1000 Hz, that is, the measured device generates 100 pieces of data per second, and the oscilloscope collects 1000 pieces of data per second. A ratio that is of the frequency to the baud rate and that is obtained through calculation is 10:1, and according to the ratio, one piece of data extracted from every 10 pieces of data from all the high and low level signals is used as the valid digital signal. If the quantity of all the high and low level signals is 2000, and one piece of data extracted from every 10 pieces of data is used as the valid digital signal, 200 valid digital signals are obtained. The valid digital signal is determined through the collection frequency of the oscilloscope and the baud rate of the measured device, and the sampling frequency of the oscilloscope may be set for different measured devices, so that the sampling frequency of the oscilloscope is close to the baud rate of the measured device to eliminate a large number of invalid data, improve obtaining of valid data and improve efficiency of data processing.

304: A waveform image of the digital signal is displayed.

The waveform image of the digital signal is displayed on the oscilloscope. Since the voltage signal may also be a waveform image and displayed on the oscilloscope, an image obtained by superimposing the waveform image of the digital signal on the waveform image of the voltage signal may be displayed on the oscilloscope.

It should be noted that, for technical details not described in detail in steps 301-304 in the embodiments of the present invention, reference may be made to the specific description of the foregoing embodiments.

In the embodiments of the present invention, the high and low level signals in the voltage signal are determined according to the reference voltage, and the valid digital signal is determined from the high and low level signals, so that the voltage signal may be converted into the digital signal without digital processing on the voltage signal via a hardware device such as an analog converter, thereby reducing costs of the oscilloscope and facilitating user operation and carrying.

Embodiment 3

Figure 4:
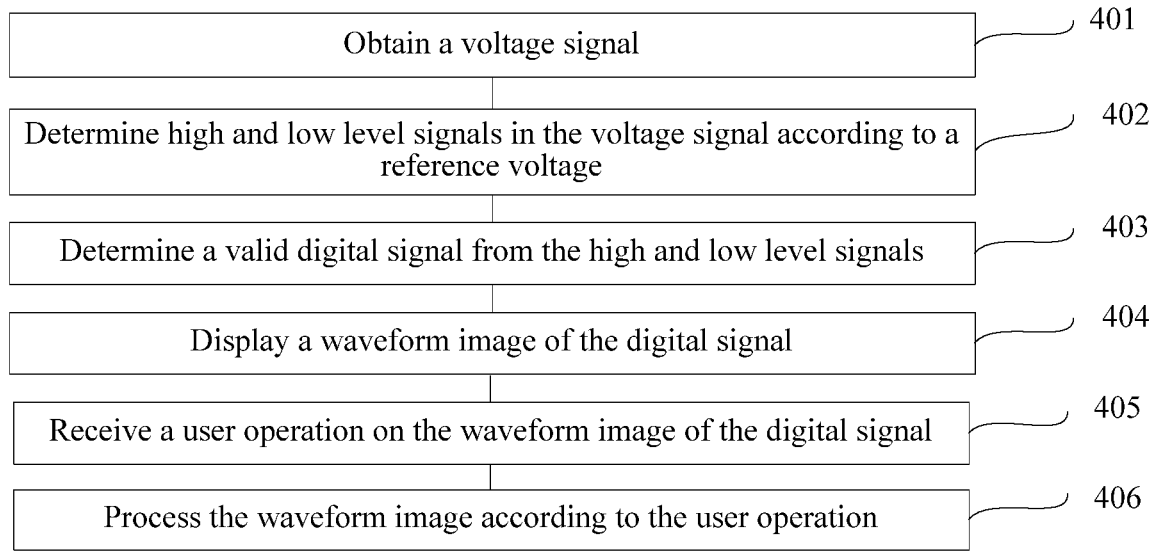
FIG. 4 is a schematic flowchart of a method for processing an oscilloscope signal according to another embodiment of the present invention.

FIG. 4 is a schematic flowchart of a method for processing an oscilloscope signal according to another embodiment of the present invention. The method for processing the oscilloscope signal provided in another embodiment of the present invention is applied to an oscilloscope, and may be performed by the oscilloscope 20 in FIG. 1.

Referring to FIG. 4, the method for processing the oscilloscope signal includes the following steps.

401: A voltage signal is obtained.

An oscilloscope is connected to a measured device to obtain the voltage signal. The voltage signal is an analog signal, and the voltage signal is a voltage that changes with time and may be represented as a waveform.

402: High and low level signals in the voltage signal are determined according to a reference voltage.

The reference voltage may be a user-defined voltage value. For example, a user input operation is received to obtain a reference voltage. In some embodiments, the reference voltage may further be a voltage value predefined by a system. The reference voltage is compared with all the data in the voltage signal to determine the high and low level signals in the voltage signal. For example, the reference voltage is 0 V, and the reference voltage is compared with all voltage values in the voltage signal. A voltage signal with a voltage value less than 0 V is set as a low level signal, and a voltage signal with a voltage value greater than 0 V is set as a high level signal. A value of the high level signal is represented by a number "1", and a value of the low level signal is represented by a number "0". The high and low level signals in the voltage signal are determined through the reference voltage, and amplitude values of each data point of the voltage signal may be converted into high and low level signals.

403: A valid digital signal is determined from the high and low level signals.

Since an amount of data generated by the measured device per second and an amount of data collected by the oscilloscope per second may be inconsistent or differ considerably, when the two are inconsistent or differ considerably, there is a large amount of invalid duplicated data in data collected by the oscilloscope. Therefore, it is necessary to eliminate invalid data and obtain valid data, that is, necessary to determine the valid digital signal from the high and low level signals. The determining a valid digital signal from the high and low level signals may include: obtaining a baud rate of a measured device; obtaining collection frequencies of the high and low level signals; and determining a valid digital signal from the high and low level signals according to the collection frequency and the baud rate. Further, the determining a valid digital signal from the high and low level signals according to the collection frequency and the baud rate may include: calculating a ratio of the collection frequency to the baud rate; using, according to the ratio, a signal obtained through extraction from the high and low level signals at an equal interval as the digital signal.

For example, the baud rate of the measured device is 100 Baud, that is, the measured device generates 100 pieces of data per second. The sampling frequency of the oscilloscope is 1000 Hz, that is, the oscilloscope collects 1000 pieces of data per second. Since the high and low level signals are determined based on the reference voltage, the high and low level signals have a same frequency as the voltage signal, that is, the collection frequency of the high and low level signals is 1000 Hz. A ratio that is of the collection frequency to the baud rate and that is obtained through calculation is 10:1, and according to the ratio, a signal obtained through extracting one piece of data from every 10 pieces of data from all the high and low level signals is used as the digital signal. For example, if the amount of data of all the high and low level signals is 2000, and 1 piece of data is extracted from every 10 pieces of data, the amount of data of the obtained signal is 200, and the signal is used as the digital signal. The digital signal may be binary data, such as "110101110000" and the like. The digital signal is determined through the collection frequency and the baud rate, and the sampling frequency of the oscilloscope may be set for different measured devices, so that the sampling frequency of the oscilloscope is close to the baud rate of the measured device to eliminate a large number of invalid data, improve obtaining of valid data and improve efficiency of data processing.

404: A waveform image of the digital signal is displayed.

Figure 5:
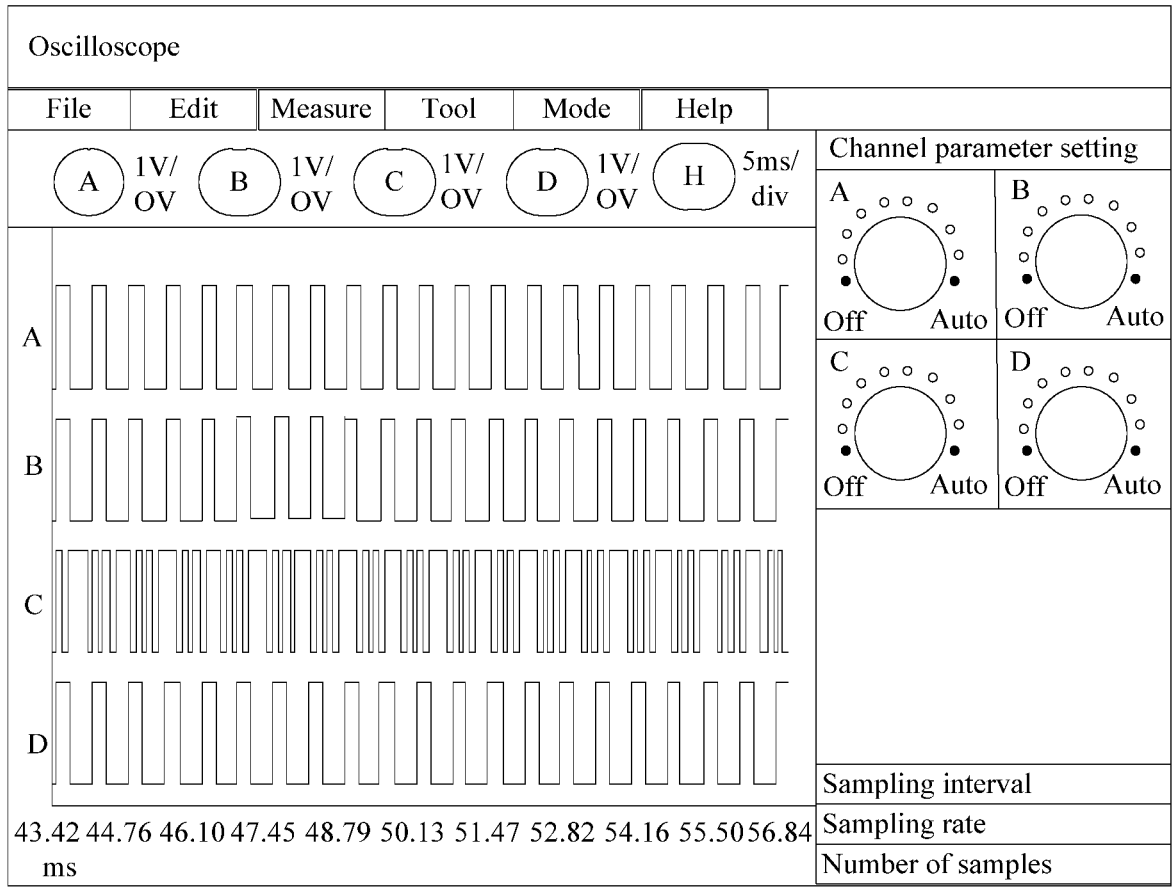
FIG. 5 is a schematic diagram of displaying a waveform image of a digital signal according to another embodiment of the present invention.

The digital signal includes binary data, such as "110101110000" and the like. In addition, each of the digital signals has a corresponding time and amplitude ("1" or "0"), a pixel of each of the digital signals corresponding to an interface of the oscilloscope is used as a waveform image of the digital signal, and the waveform image of the digital signal is displayed on the interface. The waveform image may be a square wave or the like. In addition, a waveform image of a multi-channel digital signal may be displayed. Specifically, as shown in FIG. 5, FIG. 5 is a schematic diagram of a waveform image that is of the digital signal and that is displayed on an interface of an oscilloscope. In FIG. 5, waveform images of four different channels A, B, C and D are displayed.

Since the voltage signal may also be a waveform image and may be displayed on the oscilloscope, an image obtained by superimposing the waveform image of the digital signal on the waveform image of the voltage signal may be displayed on the oscilloscope. Furthermore, a correspondence between the digital signal and the voltage signal may be shown more clearly.

405: A user operation on the waveform image of the digital signal is received.

The oscilloscope may receive the user operation on the waveform image of the digital signal, to process the waveform image of the digital signal.

406: The waveform image is processed according to the user operation.

The processing the waveform image according to the user operation includes: if the user operation is a scaling operation on the waveform image, scaling the waveform image; or if the user operation is a movement operation on the waveform image, adjusting a display segment of the waveform image; or if the user operation is a viewing operation on the waveform image, displaying a signal parameter that is related to an image area indicated by the viewing operation and that is in the waveform image.

Specifically, when the user operation is a scaling operation on the waveform image, an entire waveform image may be scaled, or a portion of the waveform image may be scaled. For example, the oscilloscope provides a selection tool, and the selection tool may be used to scale and display the selected waveform image during the corresponding time period. When the waveform image during the time period is displayed relatively intensively, the scaling operation may be used to magnify the waveform image during the time period for easy observation. When the waveform image during the time period is displayed relatively loosely, the scaling operation may be used to reduce the waveform image during the time period, thereby adjusting the waveform image within a display range suitable for a user to observe.

When the user operation is a movement operation on the waveform image, the waveform image may be dragged to adjust a display segment of the waveform image. The waveform image may be dragged left and right, or the waveform image may be dragged up and down, to adjust the display segment of the waveform image. The waveform image is dragged, which is convenient for users to observe waveform images in different time periods as required.

When the user operation is a viewing operation on the waveform image, the signal parameter that is related to an image area indicated by the viewing operation and that is in the waveform image is displayed. The signal parameter may include a pulse width of a level signal corresponding to the image area indicated by the viewing operation. The pulse width of the level signal refers to a time for which the level signal lasts. When the oscilloscope detects that a mouse pointer or a touch operation of the user is located in the image area indicated by the viewing operation, the pulse width of the level signal corresponding to the image area indicated by the viewing operation may be displayed, to automatically display the pulse width without measuring the pulse width of the high and low level signals to obtain the pulse width thereof.

For example, the oscilloscope records, in advance, a time between a start point and an end point at which a high level signal or a low level signal successively appears in the valid digital signal. When it is detected that the mouse pointer is located in the image area (the image area may be a position near a high level signal or a low level signal in a waveform image or a position in a waveform image in which a high level signal or a low level signal is located) indicated by the viewing operation, the pulse width of the level signal corresponding to the image area indicated by the viewing operation is displayed. For example, if a start time of the high level signal is 1 us and an end time is 10 us, the high level signal lasts for 9 us, that is, a pulse width of the high level signal is 9 us. In this way, when the mouse pointer is located on the high level signal, the pulse width of the high level signal is triggered to be displayed. The mouse pointer is used to identify a mouse position on an interface.

It may be understood that, in some other embodiments, steps 405-406 may not be required in different embodiments. In addition, those skilled in the art may understand, according to the description of the embodiments of the present invention, that in different embodiments, if there is no contradiction, steps 401-406 may have different execution orders.

It should be noted that, for technical details not described in detail in steps 401-406 in the embodiments of the present invention, reference may be made to the specific description of the foregoing embodiments.

In the embodiments of the present invention, the high and low level signals in the voltage signal are determined according to the reference voltage, and the valid digital signal is determined from the high and low level signals, so that the voltage signal may be converted into the digital signal without digital processing on the voltage signal via a hardware device such as an analog converter, thereby reducing costs of the oscilloscope and facilitating user operation and carrying.

Embodiment 4

Figure 6:
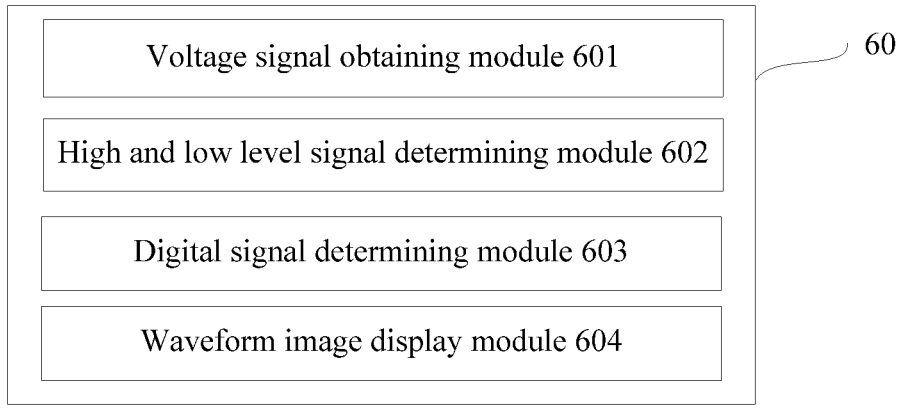
FIG. 6 is a schematic diagram of an apparatus for processing an oscilloscope signal according to another embodiment of the present invention.

FIG. 6 is a schematic diagram of an apparatus for processing an oscilloscope signal according to an embodiment of the present invention. The apparatus for processing the oscilloscope signal provided in an embodiment of the present invention may be disposed in an oscilloscope.

Referring to FIG. 6, the apparatus 60 for processing the oscilloscope signal includes the following.

A voltage signal obtaining module 601 is configured to obtain a voltage signal.

The voltage signal is an analog signal, which is a voltage that changes with time and may be represented as a waveform.

A high and low level signal determining module 602 is configured to determine high and low level signals in the voltage signal according to a reference voltage.

The reference voltage may be a user-defined voltage value. For example, a user input operation is received to obtain a reference voltage. In some embodiments, the reference voltage may further be a preconfigured voltage value. The high and low level signal determining module 602 compares the reference voltage with all the data in the voltage signal to determine the high and low level signals in the voltage signal. For example, the reference voltage is 0 V, and the high and low level signal determining module 602 compares the reference voltage with all voltage values in the voltage signal. A voltage signal with a voltage value less than 0 V is set as a low level signal, and a voltage signal with a voltage value greater than 0 V is set as a high level signal. A value of the high level signal is represented by a number "1", and a value of the low level signal is represented by a number "0". The high and low level signals in the voltage signal are determined through the reference voltage, and amplitude values of each data point of the voltage signal may be converted into high and low level signals.

A digital signal determining module 603 is configured to determine a valid digital signal from the high and low level signals.

Since an amount of data generated by a measured device per unit time is inconsistent with an amount of data collected by the oscilloscope per unit time, the digital signal determining module 603 is required to determine a valid digital signal from the high and low level signals in the voltage signal and remove invalid high and low level signals. The digital signal determining module 603 may obtain the valid digital signal using any suitable method. For example, the digital signal determining module 603 determines the valid digital signal according to the baud rate of the measured device and a frequency at which the oscilloscope collects the voltage signal. The baud rate of the measured device refers to the amount of data generated by the measured device per second, and the frequency at which the voltage signal is collected refers to the amount of data collected by the oscilloscope per second, that is, the sampling frequency of the oscilloscope. For example, the baud rate of the measured device is 100 Baud. The sampling frequency of the oscilloscope is 1000 Hz, that is, the measured device generates 100 pieces of data per second, and the oscilloscope collects 1000 pieces of data per second. The digital signal determining module 603 obtains a ratio 10:1 of the frequency to the baud rate through calculation, and according to the ratio, extracts one piece of data from every 10 pieces of data from all the high and low level signals as the valid digital signal. If the quantity of all the high and low level signals is 2000, and one piece of data extracted from every 10 pieces of data is used as the valid digital signal, 200 valid digital signals are obtained. The digital signal determining module 603 determines the valid digital signal through the collection frequency of the oscilloscope and the baud rate of the measured device, and may set the sampling frequency of the oscilloscope for different measured devices, so that the sampling frequency of the oscilloscope is close to the baud rate of the measured device to eliminate a large number of invalid data, improve obtaining of valid data and improve efficiency of data processing.

A waveform image display module 604 is configured to display a waveform image of the digital signal.

The waveform image display module 604 displays the waveform image of the digital signal. Since the voltage signal may also be a waveform image and may be displayed through the waveform image display module 604, an image obtained by superimposing the waveform image of the digital signal on the waveform image of the voltage signal may be displayed through the waveform image display module 604.

It should be noted that, in the embodiment of the present invention, the apparatus 60 for processing the oscilloscope signal may perform the method for processing the oscilloscope signal provided in Embodiment 2 of the present invention, and has corresponding function modules and beneficial effects for performing the method. For technical details not described in detail in the embodiment of the apparatus 60 for processing the oscilloscope signal, reference may be made to the method for processing the oscilloscope signal provided in Embodiment 2 of the present invention.

Embodiment 5

Figure 7:
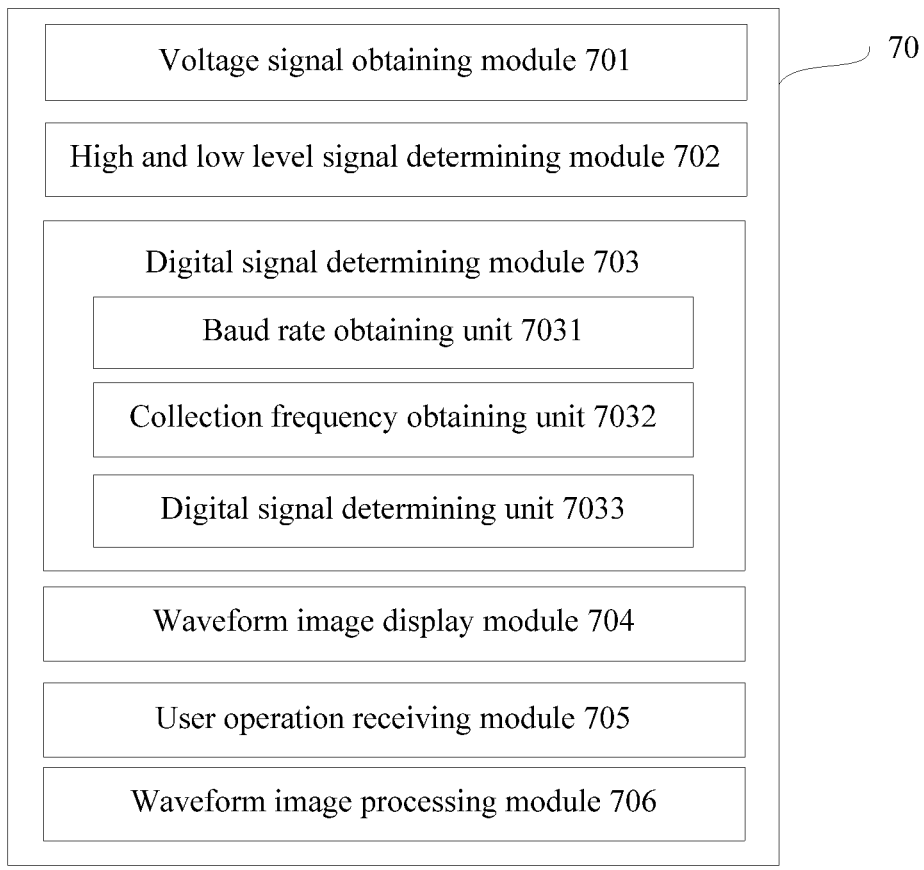
FIG. 7 is a schematic diagram of an apparatus for processing an oscilloscope signal according to another embodiment of the present invention.

FIG. 7 is a schematic diagram of an apparatus for processing an oscilloscope signal according to another embodiment of the present invention. The apparatus for processing the oscilloscope signal provided in another embodiment of the present invention may be disposed in an oscilloscope.

Referring to FIG. 7, the apparatus 70 for processing the oscilloscope signal includes the following.

A voltage signal obtaining module 701 is configured to obtain a voltage signal.

The voltage signal is an analog signal, which is a voltage that changes with time and may be represented as a waveform.

A high and low level signal determining module 702 is configured to determine high and low level signals in the voltage signal according to a reference voltage.

The reference voltage may be a user-defined voltage value. For example, a user input operation is received to obtain a reference voltage. In some embodiments, the reference voltage may further be a preconfigured voltage value. The high and low level signal determining module 702 compares the reference voltage with all the data in the voltage signal to determine the high and low level signals in the voltage signal. For example, the reference voltage is 0 V, and the high and low level signal determining module 702 compares the reference voltage with all voltage values in the voltage signal. A voltage signal with a voltage value less than 0 V is set as a low level signal, and a voltage signal with a voltage value greater than 0 V is set as a high level signal. A value of the high level signal is represented by a number "1", and a value of the low level signal is represented by a number "0". The high and low level signal determining module 702 determines high and low level signals in the voltage signal through the reference voltage, and may convert amplitude values of each data point of the voltage signal into high and low level signals.

A digital signal determining module 703 is configured to determine a valid digital signal from the high and low level signals.

Since an amount of data generated by the measured device per second and an amount of data collected by the oscilloscope per second may be inconsistent or differ considerably, when the two are inconsistent or differ considerably, there is a large amount of invalid duplicated data in data collected by the oscilloscope. Therefore, it is necessary to eliminate invalid data and obtain valid data, that is, the digital signal determining module 703 is required to determine the valid digital signal from the high and low level signals. The digital signal determining module 703 includes: a baud rate obtaining unit 7031 configured to obtain a baud rate of a measured device; a collection frequency obtaining unit 7032 configured to obtain collection frequencies of the high and low level signals; and a digital signal determining unit 7033 configured to determine a valid digital signal from the high and low level signals according to the collection frequency and the baud rate. Further, the digital signal determining unit 7033 is specifically configured to: calculate a ratio of the frequency to the baud rate; and use, according to the ratio, a signal obtained through extraction from the high and low level signals at an equal interval as the digital signal.

For example, the baud rate of the measured device is 100 Baud, that is, the measured device generates 100 pieces of data per second. The sampling frequency of the oscilloscope is 1000 Hz, that is, the oscilloscope collects 1000 pieces of data per second. Since the high and low level signals are determined based on the reference voltage, the high and low level signals have a same frequency as the voltage signal, that is, the collection frequency of the high and low level signals is 1000 Hz. The digital signal determining unit 7033 obtains a ratio 10:1 of the collection frequency to the baud rate through calculation, and uses, according to the ratio, a signal obtained through extracting one piece of data from every 10 pieces of data from all the high and low level signals as the digital signal. For example, if the amount of data of all the high and low level signals is 2000, and 1 piece of data is extracted from every 10 pieces of data, the amount of data of the obtained signal is 200, and the signal is used as the digital signal. The digital signal may be binary data, such as "110101110000" and the like. The digital signal is determined through the collection frequency and the baud rate, and the sampling frequency of the oscilloscope may be set for different measured devices, so that the sampling frequency of the oscilloscope is close to the baud rate of the measured device to eliminate a large number of invalid data, improve obtaining of valid data and improve efficiency of data processing.

A waveform image display module 704 is configured to display a waveform image of the digital signal.

The digital signal includes binary data, such as "110101110000" and the like. In addition, each of the digital signals has a corresponding time and amplitude ("1" or "0"), and the waveform image of the digital signal is displayed through the waveform image display module 704. The waveform image may be a square wave or the like. In addition, a waveform image of a multi-channel digital signal may be displayed. Since the voltage signal may also be a waveform image and may be displayed through the waveform image display module 704, an image obtained by superimposing the waveform image of the digital signal on the waveform image of the voltage signal may be displayed through the waveform image display module 704. Furthermore, a correspondence between the digital signal and the voltage signal may be shown more clearly.

A user operation receiving module 705 is configured to receive a user operation on the waveform image of the digital signal.

The user operation receiving module 705 may receive the user operation on the waveform image of the digital signal, to process the waveform image of the digital signal.

A waveform image processing module 706 is configured to process the waveform image according to the user operation.

The waveform image processing module is specifically configured to: if the user operation is a scaling operation on the waveform image, scale the waveform image; or if the user operation is a movement operation on the waveform image, adjust a display segment of the waveform image; or if the user operation is a viewing operation on the waveform image, display a signal parameter that is related to an image area indicated by the viewing operation and that is in the waveform image.

Specifically, when the user operation is a scaling operation on the waveform image, the waveform image processing module 706 may scale an entire waveform image, or may scale a portion of the waveform image. For example, a selection tool is provided, and the waveform image processing module 706 may scale and display the selected waveform image during the corresponding time period through the selection tool. When the waveform image during the time period is displayed relatively intensively, the scaling operation may be used to magnify the waveform image during the time period for easy observation. When the waveform image during the time period is displayed relatively loosely, the scaling operation may be used to reduce the waveform image during the time period, thereby adjusting the waveform image within a display range suitable for a user to observe.

When the user operation is a movement operation on the waveform image, the waveform image processing module 706 may drag the waveform image to adjust a display segment of the waveform image. The waveform image processing module 706 may drag the waveform image left and right, or may drag the waveform image up and down, to adjust the display segment of the waveform image. The waveform image is dragged, which is convenient for users to observe waveform images in different time periods as required.

When the user operation is a viewing operation on the waveform image, the waveform image processing module

706 may display the signal parameter that is related to an image area indicated by the viewing operation and that is in the waveform image. The signal parameter may include a pulse width of a level signal corresponding to the image area indicated by the viewing operation. The pulse width of the level signal refers to a time for which the level signal lasts. When the oscilloscope detects that a mouse pointer or a touch operation of the user is located in the image area indicated by the viewing operation, the pulse width of the level signal corresponding to the image area indicated by the viewing operation may be displayed, to automatically display the pulse width without measuring the pulse width of the high and low level signals to obtain the pulse width thereof. For example, a time between a start point and an end point at which a high level signal or a low level signal successively appears in the valid digital signal is recorded in advance. When the waveform image processing module 706 detects that the mouse pointer is located in the image area (the image area may be a position near a high level signal or a low level signal in a waveform image or a position in a waveform image in which a high level signal or a low level signal is located) indicated by the viewing operation, the pulse width of the level signal corresponding to the image area indicated by the viewing operation is displayed. For example, if a start time of the high level signal is 1 us and an end time is 10 us, the high level signal lasts for 9 us, that is, a pulse width of the high level signal is 9 us. In this way, when the mouse pointer is located on the high level signal, the pulse width of the high level signal is triggered to be displayed. The mouse pointer is used to identify a mouse position on an interface.

It should be noted that, in the embodiment of the present invention, the apparatus 70 for processing the oscilloscope signal may perform the method for processing the oscilloscope signal provided in Embodiment 3 of the present invention, and has corresponding function modules and beneficial effects for performing the method. For technical details not described in detail in the embodiment of the apparatus 70 for processing the oscilloscope signal, reference may be made to the method for processing the oscilloscope signal provided in Embodiment 3 of the present invention.

Embodiment 6

Figure 8:
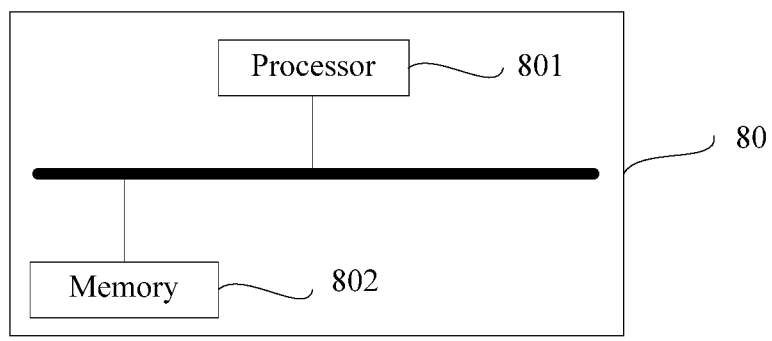
FIG. 8 is a schematic structural diagram of hardware of an oscilloscope according to an embodiment of the present invention.

FIG. 8 is a schematic structural diagram of hardware of an oscilloscope according to an embodiment of the present invention. As shown in FIG. 8, an oscilloscope 80 includes: one or more processors 801 and a memory 802, one processor 801 being used as an example in FIG. 8.

The processor 801 and the memory 802 may be connected through a bus or in other manners. In FIG. 8, the processor and the memory being connected through a bus is used as an example.

As a non-volatile computer readable storage medium, the memory 802 may be configured to store a non-volatile software program, a non-volatile computer executable program, and a module, for example, a program instruction/module (for example, the voltage signal obtaining module 701, the high and low level signal determining module 702, the digital signal determining module 703, the waveform image display module 704, the user operation receiving module 705 and the waveform image processing module 706 that are shown in FIG. 7) corresponding to the method for processing the oscilloscope signal provided in Embodiment 2 or Embodiment 3 of the present invention. The processor 801 executes various functional applications and data processing of the oscilloscope by running a non-volatile software program, an instruction and a module stored in the memory 802, that is, the method for processing the oscilloscope signal provided in Embodiment 2 or Embodiment 3 of the method is implemented.

The memory 802 may include a program storage area and a data storage area, where the program storage area may store an operating system, an application required for at least one function, and the data storage area may store data and the like created according to use of the oscilloscope. In addition, the memory 802 may include a high speed random access memory, and may further include a non-volatile memory, such as at least one magnetic disk storage device, a flash memory device or other non-volatile solid state storage devices. In some embodiments, the memory 802 may optionally include remotely located memories relative to the processor 801, and these remote memories may be connected to the oscilloscope via a network. The embodiment of the network includes, but is not limited to, the Internet, an intranet, a local area network, a mobile communications network, and a combination thereof.

The one or more modules are stored in the memory 802. When executed by the one or more processors 801, the one or more modules perform the method for processing the oscilloscope signal provided in Embodiment 2 or Embodiment 3 of the present invention, for example, perform step 401 to step 406 of the foregoing method in FIG. 4, or implement functions of the modules 701-706 in FIG. 7.

For example, the oscilloscope 80 may further include a communication interface, the communication interface being configured to implement communication with a terminal device or other devices such as a server. Other apparatuses included in the oscilloscope 80 are not limited herein.

The oscilloscope may perform the method for processing the oscilloscope signal provided in Embodiment 2 or Embodiment 3 of the present invention, and has corresponding functional modules and beneficial effects for performing the method. For technical details not described in detail in the embodiment of the oscilloscope, reference may be made to the method for processing the oscilloscope signal provided in Embodiment 2 or Embodiment 3 of the present invention.

An embodiment of the present invention provides a computer program product that includes a computer program stored on a non-volatile computer-readable storage medium. The computer program includes program instructions that, when executed by an oscilloscope, cause the oscilloscope to perform the method for processing the oscilloscope signal provided in Embodiment 2 or Embodiment 3 of the present invention. For example, step 401 to step 406 of the foregoing method in FIG. 4 are performed, or functions of the modules 701-706 in FIG. 7 are implemented.

An embodiment of the present invention provides a non-volatile computer-readable storage medium that stores computer-executable instructions, which are used to cause an oscilloscope to perform the method for processing the oscilloscope signal provided in Embodiment 2 or Embodiment 3 of the present invention. For example, step 401 to step 406 of the foregoing method in FIG. 4 are performed, or functions of the modules 701-706 in FIG. 7 are implemented.

It should be noted that, the apparatus embodiment described above is merely exemplary, and the modules described as separate components may or may not be physically separate, the components displayed as units may or may not be physical units, that is, may be located in one place, or may be distributed on a plurality of network units. Part or all of the modules may be selected according to actual needs to achieve the objective of the solution of this embodiment Through the description of the above embodiments, a person skilled in the art can clearly understand that the embodiments can be implemented by means of software plus a general hardware platform, and certainly, can also be implemented by hardware. A person of ordinary skill in the art can understand that all or part of the procedures in the method of the embodiment can be completed by computer program instructions related hardware. The program can be stored in a computer-readable storage medium, and when the program is executed, the procedure of the embodiment of each method may be included. The storage medium may be a magnetic disk, an optical disc, a read-only memory (ROM), or a random access memory (RAM).

Finally, it should be noted that: the above embodiments are only used to describe the technical solution of the present invention, but not limited thereto; under the thought of the present invention, the technical features in the above embodiments or different embodiments may also be combined. The steps can be implemented in any order, and there are many other variations of different aspects of the invention as described above, for brevity, they are not provided in the details; although the present invention is described in detail with reference to the foregoing embodiments, a person of ordinary skill in the art should understand that: it can still modify the technical solutions described in the foregoing embodiments, or equivalently replace some of the technical features; and these modifications or replacements do not deviate the spirit of the corresponding technical solutions from the implementation of the present invention.

What is claimed is:

1. A method for processing an oscilloscope signal, wherein the method comprises:
    obtaining a voltage signal from a measured device, wherein the measured device comprises an electronic control unit in a vehicle;
    determining high and low level signals in the voltage signal according to a reference voltage;
    determining a valid digital signal from the high and low level signals; and
    displaying a waveform image of the valid digital signal.

2. The method according to claim 1, wherein the determining a valid digital signal from the high and low level signals comprises:
    obtaining a baud rate of the measured device;
    obtaining collection frequencies of the high and low level signals; and
    determining the valid digital signal from the high and low level signals according to the collection frequency and the baud rate.

3. The method according to claim 2, wherein the determining the valid digital signal from the high and low level signals according to the collection frequency and the baud rate comprises:
    calculating a ratio of the frequency to the baud rate; and
    using, according to the ratio, a signal obtained through extraction from the high and low level signals at an equal interval as the digital signal.

4. The method according to claim 1, wherein the method further comprises:
    receiving a user operation on the waveform image of the valid digital signal; and
    processing the waveform image according to the user operation.

5. The method according to claim 4, wherein the processing the waveform image according to the user operation comprises:
    scaling the waveform image according to a scaling operation by user on the waveform image; or
    adjusting a display segment of the waveform image according to a movement operation b user on the waveform image; or
    displaying a signal parameter that is related to an image area indicated by the viewing operation and that is in the waveform image according to a viewing operation by user on the waveform image.

6. An oscilloscope, comprising:
    at least one processor; and
    a memory communicatively connected to the at least one processor, wherein
    the memory stores instructions that may be executed by the at least one processor and that are executed by the at least one processor, so that the at least one processor can obtain a voltage signal from a measured device, wherein the measured device comprises an electronic control unit in a vehicle; determine high and low level signals in the voltage signal according to a reference voltage; determine a valid digital signal from the high and low level signals; and display a waveform image of the valid digital signal.

7. The oscilloscope according to claim 6, wherein, when the at least one processor executes the instructions to determine a valid digital signal from the high and low level signals, the at least one processor executes the steps of obtaining a baud rate of the measured device; obtaining collection frequencies of the high and low level signals, and determining a valid digital signal from the high and low level signals according to the collection frequency and the baud rate.

8. The oscilloscope according to claim 7, wherein, when the at least one processor executes the instructions to determine the valid digital signal from the high and low level signals according to the collection frequency and the baud rate, the at least one processor executes the steps of calculating a ratio of the frequency to the baud rate, and using, according to the rate, a signal obtained through extraction from the high and low level signals at an equal interval as the digital signal.

9. The oscilloscope according to claim 6, wherein, the at least one processor further executes the instructions to receive a user operation on the waveform image of the digital signal, and process the waveform image according to the user operation.

10. The oscilloscope according to claim 9, wherein, when the at least one processor executes the instructions to process the waveform image according to the user operation, the at least one processor executes the steps of scaling the waveform image according to a scaling operation by user on the waveform image; or adjusting a display segment of the waveform image according to a movement operation by user on the waveform image; or displaying a signal parameter that is related to an image area indicated by the viewing operation and that is in the waveform image according to a viewing operation by user on the waveform image.

* * * * *